United States Patent
Good

(10) Patent No.: US 7,974,801 B2
(45) Date of Patent: Jul. 5, 2011

(54) METHOD AND SYSTEM FOR A TWO-STEP PREDICTION OF A QUALITY DISTRIBUTION OF SEMICONDUCTOR DEVICES

(75) Inventor: Richard Good, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 128 days.

(21) Appl. No.: 12/366,111

(22) Filed: Feb. 5, 2009

(65) Prior Publication Data
US 2009/0276174 A1    Nov. 5, 2009

(30) Foreign Application Priority Data

Apr. 30, 2008 (DE) ............... 10 2008 021 556

(51) Int. Cl.
*G01N 37/00* (2006.01)
(52) U.S. Cl. ........... 702/81; 702/82; 702/84; 700/109
(58) Field of Classification Search ............... 702/81
See application file for complete search history.

(56) References Cited

U.S. PATENT DOCUMENTS

| | | | |
|---|---|---|---|
| 6,098,024 A * | 8/2000 | Chen et al. | 702/81 |
| 7,085,615 B2 * | 8/2006 | Persson et al. | 700/108 |
| 7,177,773 B2 * | 2/2007 | Lonn et al. | 702/81 |
| 7,338,818 B2 | 3/2008 | Arroyo et al. | 438/14 |
| 7,349,753 B2 * | 3/2008 | Paik | 700/110 |
| 2004/0059456 A1 * | 3/2004 | Bode et al. | 700/121 |
| 2004/0093107 A1 * | 5/2004 | Good et al. | 700/108 |
| 2005/0071037 A1 * | 3/2005 | Strang | 700/121 |
| 2005/0288812 A1 * | 12/2005 | Cheng et al. | 700/109 |
| 2008/0140330 A1 * | 6/2008 | Morioka et al. | 702/81 |

FOREIGN PATENT DOCUMENTS

DE  603 07 310 T2  10/2007
DE  112007000868 T5  2/2009

OTHER PUBLICATIONS

Translation of Official Communication from German Patent Office for German Patent Application No. 10 2008 021 556.2-33 dated May 6, 2009.

* cited by examiner

*Primary Examiner* — Jonathan C Teixeira Moffat
(74) *Attorney, Agent, or Firm* — Williams, Morgan & Amerson

(57) ABSTRACT

By performing a two-step approach for predicting a quality distribution during the fabrication of semiconductor devices, enhanced flexibility and efficiency may be accomplished. The two-step approach first models electrical characteristics on the basis of measurement data, such as inline measurement data, and, in a second step, an appropriate distribution for the electrical characteristics may be established, thereby obtaining modeled wafer sort data which may then be used for predicting a quality distribution of the semiconductor devices under consideration.

22 Claims, 6 Drawing Sheets

METHOD AND SYSTEM FOR A TWO-STEP PREDICTION OF A QUALITY DISTRIBUTION OF SEMICONDUCTOR DEVICES

BACKGROUND OF THE INVENTION

1. Field of the Invention

Generally, the present disclosure relates to the field of fabricating integrated circuits, and, more particularly, to the monitoring of process flow quality and production yield by evaluating measurement data.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with mass production techniques. It is, therefore, the goal of semiconductor manufacturers to reduce the consumption of raw materials and consumables while at the same time improve process tool utilization. The latter aspect is especially important since, in modern semiconductor facilities, equipment is required which is extremely cost-intensive and represents the dominant part of the total production costs. Consequently, high tool utilization in combination with a high product yield, i.e., with a high ratio of good devices to faulty devices, results in increased profitability.

Integrated circuits are typically manufactured in automated or semi-automated facilities, thereby passing through a large number of process and metrology steps to complete the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask used in further processes for forming device features in the device layer under consideration by, for example, etch, implantation, deposition, polish and anneal processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration. Since many of these processes are very critical, a plurality of metrology steps have to be performed to efficiently monitor and control the process flow. Typical metrology processes may include the measurement of layer thickness, the determination of dimensions of critical features, such as the gate length of transistors, the measurement of dopant profiles, the number, the size and the type of defects, electrical characteristics, such as the transistor drive current, the threshold voltage thereof, i.e., the voltage at which a conductive channel forms in the channel region of a field effect transistor, the transconductance, i.e., the change of drive current with gate voltage, and the like. As the majority of the process margins are device-specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach one hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools, metrology tools and the like, may be necessary. Consequently, a plurality of different tool parameter settings and product types may be encountered simultaneously in a manufacturing environment, thereby also creating a huge amount of measurement data, since the measurement data are typically categorized in accordance with the product types, process flow specifics and the like.

Hereinafter, the parameter setting for a specific process in a specified process tool or metrology or inspection tool may commonly be referred to as process recipe or simply as recipe. Thus, a large number of different process recipes, even for the same type of process tools, may be required, which have to be applied to the process tools at the time the corresponding product types are to be processed in the respective tools. However, the sequence of process recipes performed in process and metrology tools or in functionally combined equipment groups, as well as the recipes themselves, may have to be frequently altered due to fast product changes and highly variable processes involved.

Consequently, since typically several hundred process steps may be involved for forming sophisticated integrated circuits, such as CPUs, memory devices and the like, a complex sequence of manufacturing steps may be involved for each product type, wherein the finally obtained quality of the completed semiconductor product may, therefore, depend on a large number of process parameters, each of which may be subjected to a certain degree of variability due to recipe changes, process tool variations and the like. Due to the many process steps involved, which may typically require several weeks for completing the product type under consideration, it is extremely difficult to respond to customer demand within a time span that is shorter compared to the overall process time including the measurement of the final quality distribution of the product type under consideration. For example, if products of enhanced quality grade, such as microprocessors of a higher speed grade, including cache memories of increased storage capacity and the like, may be required by the customer, it may be difficult to predict whether or not a sufficient amount of products may be available on the basis of the currently being processed products, since it is difficult to assess the influence of a recipe change and the like on the final quality distribution of the products. Similarly, any disturbance of the manufacturing environment, which may be caused by subtle variations of equipment, an inappropriate setting of target values for individual process modules and the like, may remain unobserved in increased time periods, that is, until a finally obtained quality distribution may enable an estimation of the status of the manufacturing environment at the time the respective products have been produced. For example, if a measured quality distribution may indicate a sufficient amount of high quality products, while in the meantime a disturbance has occurred, a significantly reduced product quality may be produced over the next several weeks, which may result in the production of a high number of wrong products. With reference to FIGS. 1a-1b, a typical manufacturing environment for producing semiconductor products will now be described so as to discuss further problems related to the efficient estimation of the product quality during the manufacturing of semiconductor devices.

FIG. 1a schematically illustrates a manufacturing environment 150 which is to represent a facility configured to produce semiconductor products at least to a certain stage of completeness, for instance to a stage in which fully functional semiconductor devices are provided on substrates while, for instance, additional fabrication processes, such as the separation into individual semiconductor chips, the packaging thereof and the like, may be performed in other manufacturing environments. The environment 150 comprises a plurality of process tools and metrology tools, which may frequently be grouped into functional modules in which certain types of related process steps may be performed. For example, the environment 150 may comprise a plurality of process modules 160A, 160B, 160C, wherein each module may comprise a plurality of process tools and metrology tools as required for performing a plurality of related manufacturing processes. For instance, the process module 160A may represent a plurality of process tools and metrology tools which may be used for performing sophisticated lithography processes in combination with corresponding pre-exposure and post-exposure processes, development of resist material and the like. In other process modules, complex etch processes may be performed on the basis of appropriate process tools, possibly in combination with respective cleaning processes and the like, as may be required by the overall process strategy. In other cases, deposition tools may provide the capability of depositing and forming material layers with a high degree of controllability on the basis of thermally activated deposition techniques, such as low pressure chemical vapor deposition (CVD), oxidation and the like. In other process modules, implantation tools may be provided which may typically be used for incorporating any desired species, such as dopant species for modifying the conductivity of semiconductor regions and the like. Consequently, the modules 160B, 160C may represent a plurality of appropriate process tools for performing at least one manufacturing process in accordance with a predefined process recipe, wherein the recipe may change in the same process tool depending on the product type to be processed, as previously explained. It should be appreciated that dividing the manufacturing environment 150 into respective process modules may be arbitrary and may depend on the overall configuration of the manufacturing environment under consideration. Furthermore, it should be appreciated that typically a plurality of the manufacturing processes may be associated with appropriately designed metrology processes so as to monitor and control the results of the previously performed processes. Furthermore, the manufacturing environment 150 may comprise an "interface" 190 that is typically provided in the form of an automated or semi-automated transport system which interconnects the various process modules 160A, 160B, 160C in order to supply substrates to be processed and to receive substrates that have been processed in the corresponding process tools or metrology tools. For this purpose, the process modules 160A, 160B, 160C and the transport system 190 may be operated such that a desired high overall throughput of the manufacturing environment 150 may be accomplished by supplying the various product types according to their current manufacturing stage to the process modules 160A, 160B, 160C, as is required for the next step in the overall manufacturing flow. For example, on the right-hand side of FIG. 1a, a typical process flow for forming sophisticated semiconductor devices on the basis of CMOS technology is illustrated, wherein the various process stages shown may be reached by being processed in the one or more process modules 160A, 160B, 160C at least once, while typically the products may be passed through the various process modules several times, wherein the corresponding process recipes may be adapted to the desired process results to be obtained in the corresponding manufacturing stage.

For example, substrates 151 may have formed thereon a plurality of die regions 152, each of which may represent a semiconductor device including a very large number of individual circuit elements, such as transistors, capacitors, resistors and the like, as is required for the desired functional behavior of the semiconductor product under consideration. For convenience, the die regions 152 may also be referred to as semiconductor devices. As an example of a circuit element, a field effect transistor 153 may be referred to in order to demonstrate a typical overall manufacturing process. In the manufacturing stage shown, the field effect transistor 153 may comprise a gate electrode 153A, which is formed above a semiconductor region 153B and separated therefrom by a gate insulation layer 153C. As is well-known, the operational behavior of the transistor 153 may be substantially determined by the characteristics of the gate electrode 153A and the gate insulation layer 153C, as also explained above. That is, the length of the gate electrode 153A, i.e., in FIG. 1a the horizontal extension of the gate electrode 153A, in combination with the material composition and the thickness of the gate insulation layer 153C may have a significant influence on the overall controllability of a conductive channel that forms in the semiconductor region 153B at the gate insulation layer 153C upon application of an appropriate control voltage to the gate electrode 153A. Similarly, a vertical dopant profile in the semiconductor region 153B that may have previously been established prior to the formation of the gate electrode 153A may also have a significant influence on electrical characteristics of the transistor 153, for instance with respect to threshold voltage, current drive capability and the like. Consequently, since the operational behavior of the individual transistors 153 may have a significant influence on the final operational behavior of the semiconductor device 152, for instance with respect to overall speed, precise control of the manufacturing techniques for forming the gate electrodes 153A, the gate insulation layer 153C and the like may be required. For example, respective processes for forming the gate electrode 153A may be accomplished on the basis of manufacturing processes formed in at least some of the process modules 160A, 160B, 160C. For example, forming the transistor 153 as shown in this early manufacturing stage, indicated as stage I, may include sophisticated lithography techniques for forming trenches for isolation structures (not shown) and subsequently depositing appropriate materials, such as silicon dioxide, silicon nitride and the like, in accordance with specified deposition recipes. Thereafter, excess material may be removed, for instance by CMP, and thereafter a dielectric material may be formed, for instance by deposition and/or oxidation, in accordance with the requirements for forming the gate insulation layer 153C. Next, the gate electrode material may be deposited and thereafter a further sophisticated lithography process may be performed to provide an appropriate etch mask for patterning the gate electrode 153A and the gate insulation layer 153C.

In a later manufacturing stage II, the transistor 153 may, for instance, comprise a sidewall spacer structure 153D, which may be used for defining an appropriate vertical and lateral dopant profile for drain and source regions 153E. Since the spacer structure 153D at various intermediate manufacturing stages may be used as an implantation mask for defining the profile of the regions 153E, the dimensions of the spacers 153E, in combination with the implantation processes, may also have a significant influence on the overall electrical characteristics of the transistor 153. For example, respective manufacturing processes involved in forming the transistor 153 as shown in the manufacturing stage II may involve the deposition of appropriate spacer materials, such as silicon nitride, possibly in combination with etch stop materials such as silicon dioxide and the like, which may subsequently be etched in order to obtain the spacer structure 153D with a width as required for profiling the regions 153E. Thereafter, an implantation process may be performed to introduce the dopant species on the basis of appropriate implantation parameters, such as implantation energy and dose, followed by anneal processes for activating the dopants and curing implantation-induced damage.

It should be appreciated that, prior to and after the manufacturing stage II, or prior to and after the manufacturing stage I, various manufacturing processes may also have to be performed in accordance with the overall process strategy to obtain the desired transistor performance. For instance, for transistors in the deep sub-micron range, control of short channel effects may require extremely thin insulation layers which may have a thickness of 1-2 nm for silicon dioxide-based materials, which in turn may result in increased leakage currents through the gate dielectric material. Hence, further device scaling may require the incorporation of high-k dielectric materials and/or appropriate adaptation of the overall dopant profiles in the channel region of the transistor 153 to obtain an acceptable threshold voltage and maintain channel controllability, which, however, may result in a reduction of the channel conductivity. Thus, frequently, intentional strain may be created in the channel regions of the transistors in order to enhance the electron mobility to provide enhanced transistor performance for scaling the device dimensions, while the thickness of the gate dielectric material may be maintained at a thickness considered acceptable in view of leakage currents. Thus, a plurality of strain-inducing mechanisms may be employed wherein, for instance, for P-channel transistors, frequently an appropriate semiconductor alloy may be incorporated, for instance in and/or adjacent to the channel region, in order to obtain a desired type of strain. Hence, also in this case, additional complex manufacturing techniques may be required, the process results of which may also have a significant influence on the finally obtained electrical characteristics of the transistor 153.

In stage III, the semiconductor device 152 is illustrated in a further advanced manufacturing stage in which a contact structure 154 and a metallization system 155 may be provided. For example, the contact structure 154 may include an interlayer dielectric material, such as silicon dioxide and the like, in order to enclose the transistors 153, wherein respective contact elements may connect to contact areas of the transistors 153, such as the drain and source regions 153E and the gate electrode 153A. The metallization system 155 may comprise a plurality of metallization layers, wherein, for convenience, a first metallization layer 155A and a subsequent metallization layer 155B are illustrated. In the metallization layers 155A, 155B, respective metal lines and vias are provided to establish the overall required connection of the circuit elements, such as the transistors 153, in accordance with the overall circuit layout. It should be appreciated that the characteristics of the contact structure 154 and the metallization system 155 may also have a significant influence on the overall electrical performance of the semiconductor device 152. For example, in sophisticated semiconductor devices having critical dimensions of 0.1 μm, for instance with respect to the gate length, the signal propagation delay in the metallization level 155 may also play an important role and may even be more critical than corresponding signal propagation delay in the device level. Consequently, complex manufacturing strategies have been developed, for instance by replacing aluminum with copper or copper alloys and also using low-k dielectric materials in order to reduce the parasitic RC time constants in the metallization system 155. The handling of copper in the environment 150, as well as the use of low-k dielectric materials, which typically have reduced mechanical stability compared to conventional dielectrics, such as silicon dioxide, silicon nitride and the like, may require advanced manufacturing strategies which may also have a significant influence on the overall electrical performance. For example, in addition to requiring a specified electrical behavior, the metallization system 155 may also have to exhibit a certain performance with respect to electromigration in order to guarantee a specific device performance over a specified lifetime. The electromigration behavior of metal features in the metallization system 155 may significantly depend on the materials used, such as conductive and dielectric barrier materials, dielectric interlayer materials and the like, as well as the fabrication processes used, which may thus require a thorough monitoring of the processes involved in the fabrication of the metallization system 155.

FIG. 1b schematically illustrates the environment 150 when processing substrates 151 according to one or more specified manufacturing flows for respective product types. For example, it may be assumed that the substrates 151, which may typically be handled in the environment 150 in certain groups or lots, may represent a specific product type, such as a CPU, a memory device and the like, which may thus be processed in the environment 150 by passing the substrates 151 one or several times through the process modules 160A, 160B, 160C, as previously explained. The entire sequence of process steps may be referred to as a manufacturing flow 170, which may comprise a plurality of sequences 170A, 170B, 170C which, for instance, may be performed in the corresponding modules 160A, 160B, 160C according to appropriate process recipes corresponding to the respective manufacturing stage, as previously explained. Typically, respective manufacturing processes 171 may be associated with a corresponding metrology process 172, at least in many of the sequences 170A, 170B, 170C, in order to monitor and control the overall process quality. For example, in the sequence 170A, the metrology process 172 may provide measurement data which may be used for controlling the associated manufacturing process or processes 171, for instance by providing a corresponding feedback control loop. For example, upon measuring the line width of resist features after exposing and developing a resist material for forming an etch mask for patterning the gate electrodes 153A, the exposure dose of the lithography process may be adjusted for subsequent substrates to be processed, thereby providing an efficient feedback control mechanism. However, since a plurality of further manufacturing processes may be involved for forming a corresponding resist mask, such as pre-exposure baking, post-exposure baking, spin-coating of the resist material, accuracy of the alignment process and the like, and due to the fact that the measuring of the process output may be performed on the basis of selected samples in view of overall throughput of the environment 150, a certain degree of variability of the process output may nevertheless occur.

Furthermore, due to the restricted amount of measurement data, since not all die regions of each substrate can be measured for economical reasons, typically predictive control algorithms may be used, in particular when a certain degree of delay is involved in obtaining the measurement data, in which the process results may be calculated on the basis of measurement data and the tool settings may be predicted for a currently being processed product so as to obtain the desired outcome. Furthermore, respective measurement results obtained in one sequence 170A may also be used in other processes still to be performed, thereby providing a respective feed forward control mechanism. Typically, the overall process flow 170 may be controlled on the basis of a supervised control system, such as an MES (manufacturing execution system) 180, which is responsible for the appropriate material supply and initialization of the appropriate process recipe at the various process tools. Thus, after completing the manufacturing flow 170, which may include several hundred individual process steps, the substrate 151 may have formed thereon the semiconductor devices 152, wherein, however, across the various substrates 151 and also within each individual substrate 151, a variation of the finally obtained electrical characteristic of the devices 152 may be observed. For this reason, a final electrical test for obtaining representative electrical characteristics of the devices 152 may be performed for each of the devices 152 of each substrate 151 leaving the environment 150, which is typically referred to as electrical wafer sort process, wherein the corresponding electrical characteristics, such as operating speed in the form of a ring oscillator frequency, current drive capability, overall power consumption, access time for memory cells, the amount of available storage in storage devices or CPU cache areas, threshold voltage of transistors and the like, may be determined, which is a time-consuming process.

Furthermore, the respective electrical characteristics may be used to determine a yield or quality distribution for the devices 152 for the plurality of substrates 151, for instance with respect to certain quality specifications, such as speed grade and the like. Consequently, in view of economic reasons, the environment 150 should provide a high throughput with a quality distribution in accordance with specific customer demands. Although the environment 150 may include a plurality of efficient control mechanisms in the form of metrology processes and respective control strategies, such as APC (advanced process control) strategies, the environment 150 may represent a complex organism in which even subtle changes in some parts of the "organism" may result in a significantly different final quality distribution of the electrical characteristics, which may finally define the overall functional behavior of the semiconductor devices under consideration. For example, due to the complexity of the manufacturing flow 170, a non-desired quality distribution may be obtained, even though the individual sequences 170A, 170B, 170C may be within the predefined process margins. For example, it is very difficult to assess the influence of the various manufacturing processes due to the complex mutual interaction on the finally obtained quality distribution. If, for example, a different quality distribution may be required on short notice due to customer demand, it may be difficult to assess whether or not the respective quality distribution may be achieved on the basis of the currently being processed substrates, or it may be very difficult to decide how to change the process targets for the various sequences in view of the new desired quality distribution. Thus, great efforts are made in predicting the finally obtained quality distribution on the basis of measurement results, which may conventionally be accomplished by estimating the electrical parameters of the completed product by using a small number of measurement results, for which correlations with the finished product are known. However, due to the high complexity, as previously explained, the large number of unknown influences may nevertheless result in a high degree of inaccuracy of the respective yield predictions so that, for instance, in view of change of quality specifications, typically products may be measured before a corresponding prediction model may be generated.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and systems for predicting the quality distribution of semiconductor products on the basis of measurement data which may be available with reduced delay, such as inline measurement data, electric measurement data representing certain manufacturing stages of the product under consideration and the like. To this end, the final electrical characteristics or parameters of completed semiconductor devices may be predicted for respective samples, for which the input measurement data are also available, wherein, in some illustrative embodiments, a plurality of measurement data sets may be used to "cover" an extended portion of the overall manufacturing flow, as the measurement data may have "encoded" therein non-detected information with respect to the mutual interaction of the various complex manufacturing processes involved. Thus, in some illustrative aspects disclosed herein, a high dimensional regression technique may be used to determine an appropriate model determining the predicted final electrical characteristics on the basis of a plurality of measurement data sets. Furthermore, based on the predicted sample electrical characteristics, an appropriate distribution of these electrical parameters may be determined, for instance, on the basis of information inherent in the initial measurement data, so that finally a yield or quality distribution may be obtained on the basis of the "complete" amount of significant parameters of the semiconductor devices under consideration. Consequently, using the quality distribution or yield prediction, the status of the complex manufacturing environment may be estimated with significantly reduced response time, thereby enabling the detection of any disturbances, while also providing the possibility of responding more efficiently to changes in view of customer demands, quality specifications and the like. Consequently, a new quality specification may be applied at any intermediate manufacturing stage without requiring additional measurements with respect to the final electrical characteristics prior to establishing a respective prediction model for the quality distribution with respect to the new quality specification.

One illustrative method disclosed herein comprises obtaining measurement data in a data processing system from a plurality of selected samples of a group of substrates after performing a first sequence of manufacturing processes in a manufacturing environment that is configured to produce semiconductor devices on the basis of a predefined overall manufacturing flow, wherein the first sequence comprises at least one production process and at least one metrology process. The method further comprises determining a plurality of predicted electrical characteristics of semiconductor devices for the plurality of selected samples using the measurement data, wherein the plurality of electrical characteristics corresponds to a state of the semiconductor devices after passing through the manufacturing flow. Finally, the method comprises determining a predicted quality distribution for the group of substrates by using the plurality of predicted electrical characteristics.

A further illustrative method disclosed herein comprises creating a model by using a multi-dimensional regression technique, wherein the model relates historical measurement data, which are obtained from a plurality of substrates comprising semiconductor devices after performing one or more manufacturing processes in a semiconductor manufacturing environment, to final electrical characteristics of the semiconductor devices. The method further comprises determining a subset of predicted values of the final electrical characteristics, wherein the subset includes the predicted values for selected samples of a group of substrates after performing the one or more manufacturing processes, by using the model and measurement data obtained from the selected samples. Additionally, the method comprises determining a complete set of predicted values of the final electrical characteristics, wherein the complete set includes the predicted values for each semiconductor device of the group. Finally, the method comprises determining a quality distribution of the semiconductor devices on the basis of the complete set of the predicted values.

One illustrative yield prediction system disclosed herein comprises an interface configured to receive measurement data related to a sequence of manufacturing processes of an overall manufacturing flow in a manufacturing environment. The yield prediction system further comprises a first prediction unit connected to the interface and configured to perform a data processing to determine final electrical characteristics of sample semiconductor devices on the basis of a multi-dimensional model and measurement data obtained from the sample semiconductor devices. Furthermore, the yield prediction system comprises a second prediction unit connected to the first prediction unit and configured to determine the electrical characteristics for each semiconductor device associated with the sample semiconductor devices and to determine a yield distribution for the semiconductor devices associated with the sample semiconductor devices.

BRIEF DESCRIPTION OF THE DRAWINGS

The disclosure may be understood by reference to the following description taken in conjunction with the accompanying drawings, in which like reference numerals identify like elements, and in which.

Figure 1A:
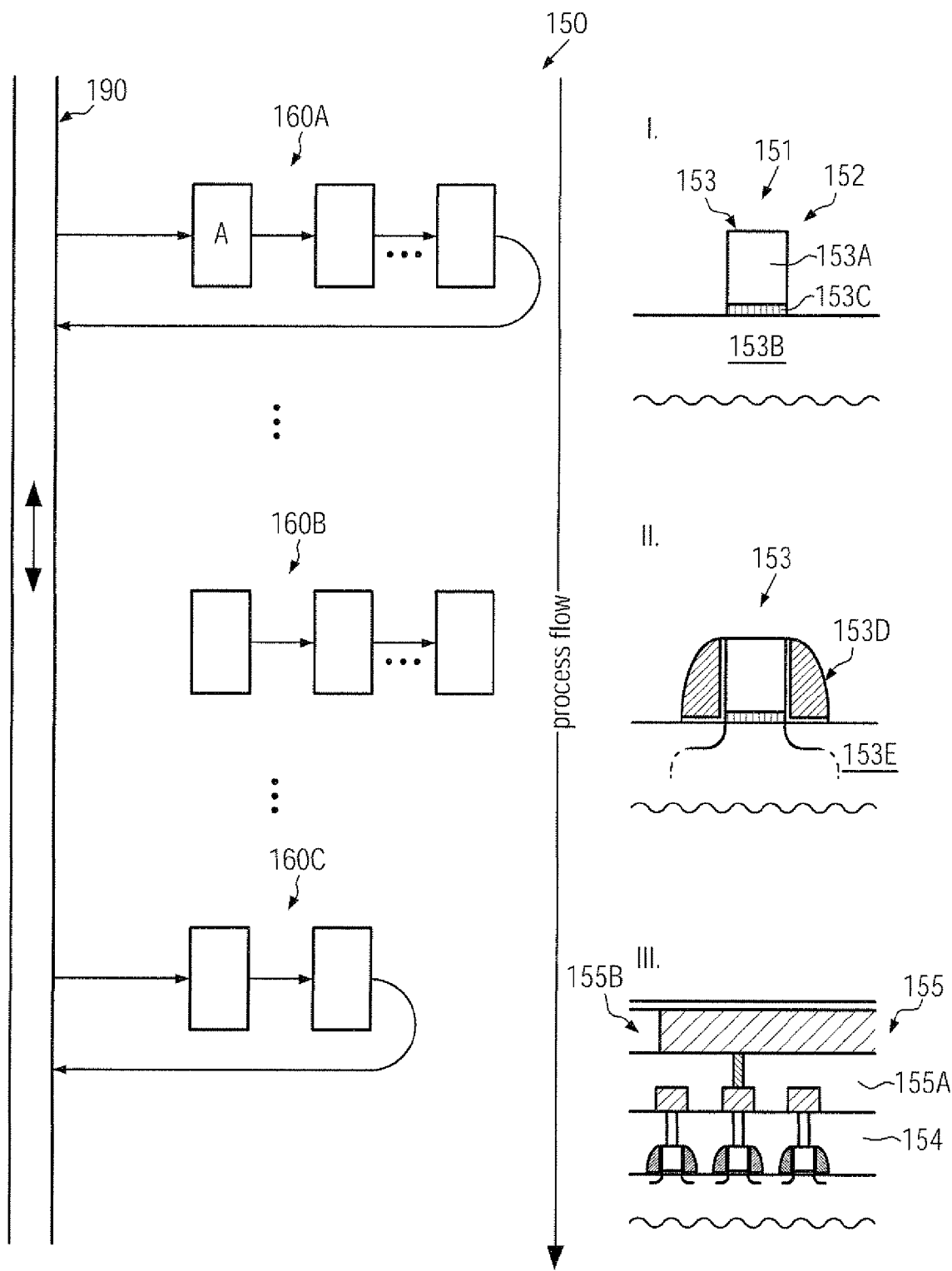
FIGS. 1a-1b schematically illustrate a manufacturing environment for performing a manufacturing flow for forming semiconductor products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, a manufacturing environment configured to produce semiconductor products may represent a complex "organism" with many interrelated functional parts, wherein the complex mutual interaction of the functional parts may determine the finally obtained quality distribution of the completed devices, wherein even a minor imbalance between some of the functional parts, although each part may be within specified process targets, may result in a significantly varied quality distribution. In view of detecting respective imbalances or disturbances of the complex organism and also in view of providing enhanced flexibility in responding to customer demand, changes of quality specification and the like, the present disclosure provides techniques and systems in which the quality distribution may be directly determined on the basis of measurement data obtained from manufacturing environments without requiring actual quality measurements. In some illustrative embodiments, the measurement data may be provided in the form of inline measurement data, i.e., measurement data obtained by process line internal measurement equipment that are part of the overall manufacturing flow, for instance for providing feedback and/or feed forward information for process monitoring and process control, so that the yield distribution prediction may not contribute to additional process complexity or reduce overall throughput. Moreover, in some illustrative embodiments, the measurement data may also include electrical measurement data obtained at any appropriate stage of the overall process flow, for instance after forming one or more metallization levels, so that the corresponding electrical measurement data may provide a "wide coverage" of the overall process flow. Due to the provision of a plurality of measurement data sets, which may be gathered from various manufacturing stages, the status of the manufacturing environment may be encoded in the measurement data and may thus be efficiently used for obtaining the quality distribution, wherein a two-step mechanism may be used in which, in a first step, the measurement data may be entered into a model to obtain respective final electrical characteristics of the measured samples. In a second step, a distribution of the final electrical characteristics may be obtained for each semiconductor device associated with the respective sample measurements so that "wafer sort data" may be created, which may thus be used for determining the quality of the individual semiconductor devices, for instance in terms of speed grade, storage capacity and the like, depending on the overall quality specifications.

Consequently, a plurality of final electrical characteristics may be predicted on the basis of a plurality of measurement data sets, wherein, in some illustrative embodiments, highly efficient high dimensional regression techniques may be used, which may therefore enable enhanced prediction of critical final electrical parameters of the semiconductor devices compared to, for instance, univariate modeling techniques which may frequently be used in conventional strategies. For example, multi-dimensional regression techniques may be used on the basis of partial least squares regression, for instance in the form of projection to latent spaces, principle component regression, multiple least squares regression and the like. Consequently, well-established powerful algorithms may be used for creating an efficient model for a moderately large number of input variables in order to determine a plurality of final electrical characteristics. Since the model may be based on a plurality of measurement data sets, the predicted final electrical characteristics may represent a "stable" base for the determination of a respective distribution of the final electrical characteristics over a plurality of substrates, for which the input measurement data are available. Hence, a corresponding quality distribution obtained from the "sort data" may therefore provide the yield distribution with an enhanced degree of accuracy, thereby enabling the detection of disturbances and an efficient response to customer demands, quality specification changes and the like. Hence, the change of quality specifications, and a change of recipe and process targets may be examined on the basis of the predicted quality distribution, thereby obtaining the results for products currently being processed.

Figure 1B:
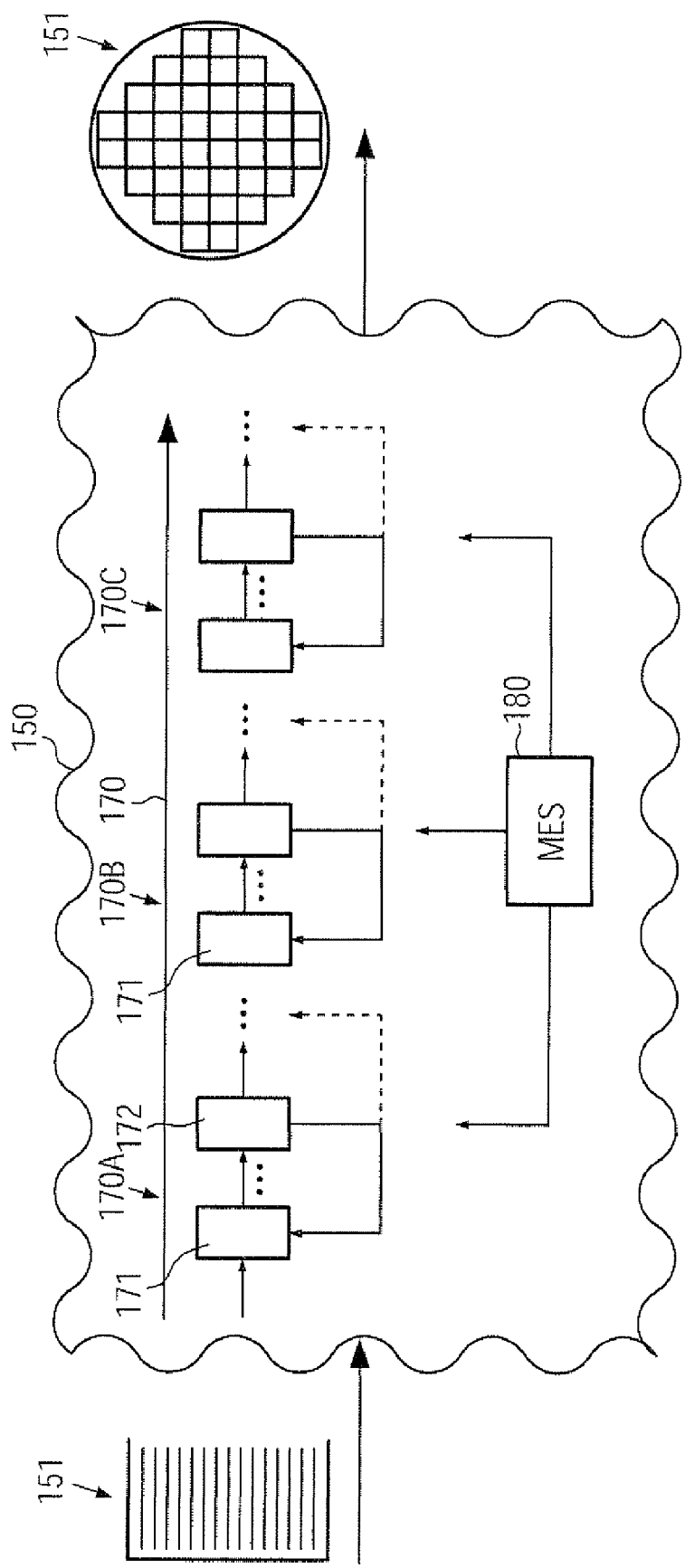
Figure 2A:
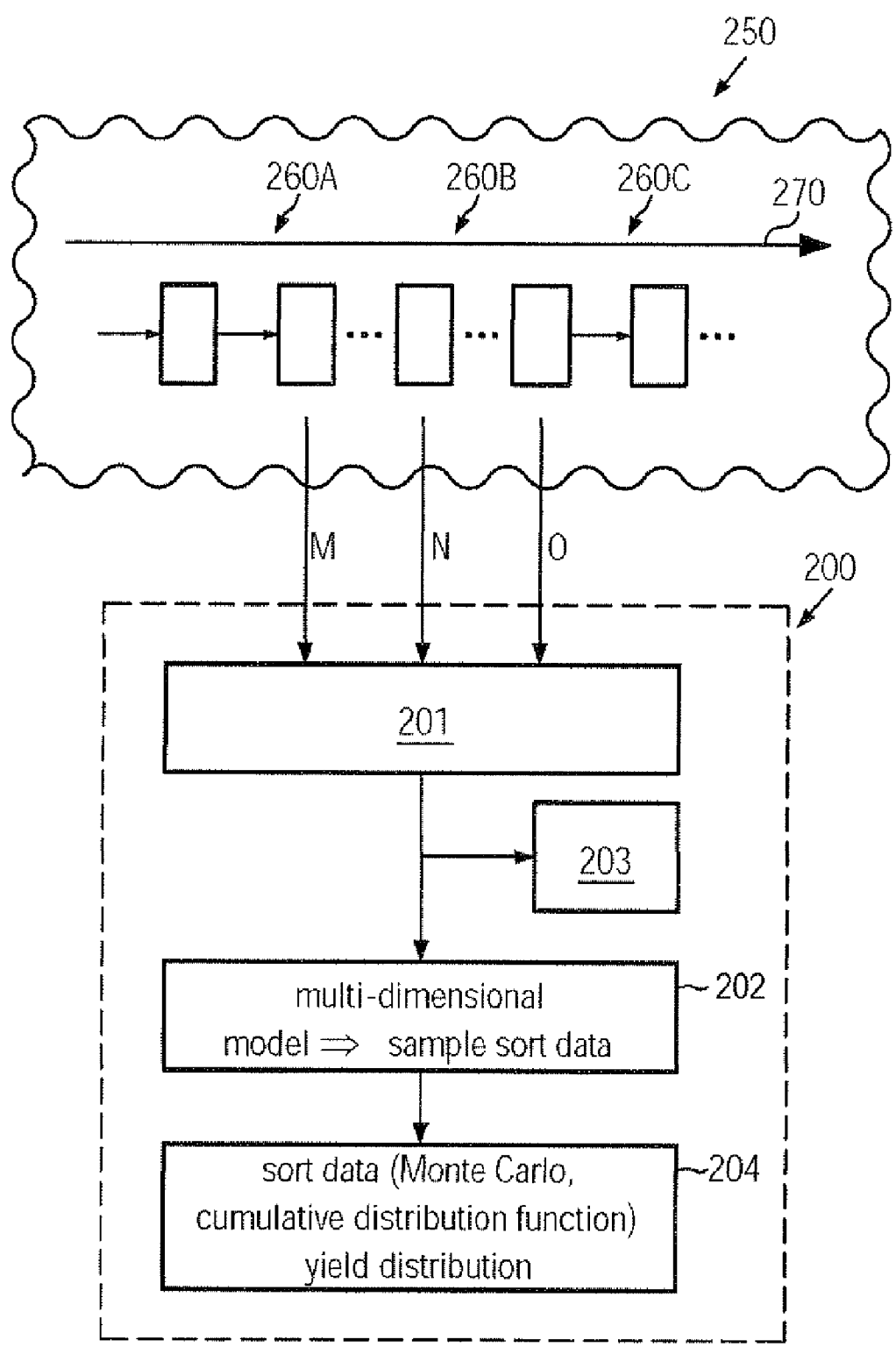
FIG. 2a schematically illustrates a yield prediction system comprising a two-step prediction technique for obtaining a quality distribution prediction on the basis of measurement data obtained from a manufacturing environment, according to illustrative embodiments.
Figure 2B:
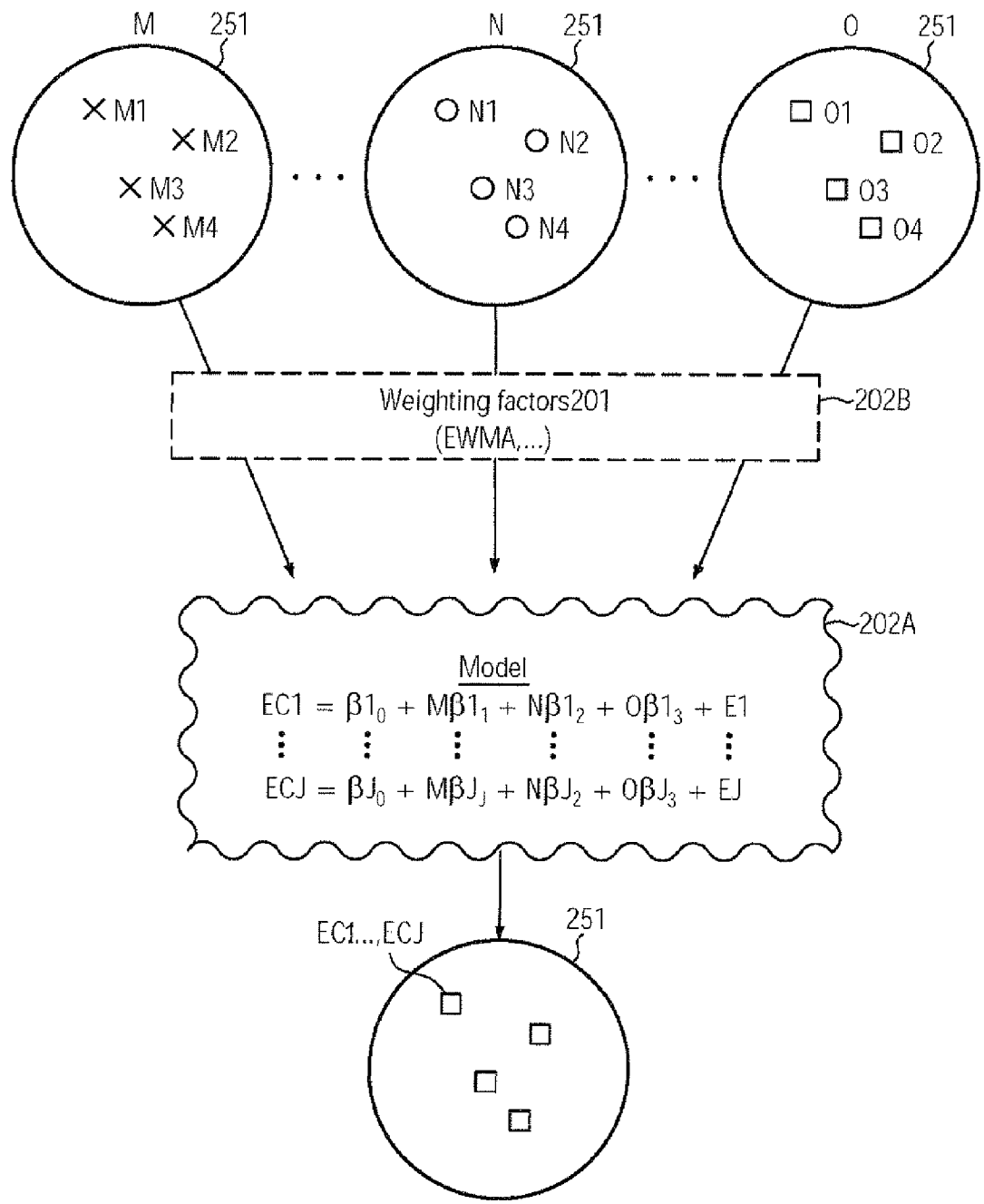
FIG. 2b schematically illustrates a first step of predicting final electrical characteristics implemented in the yield prediction system wherein measurement data, such as inline measurement data, may be obtained for selected samples for which may then be determined respective final electrical characteristics, according to illustrative embodiments.

FIG. 2a schematically illustrates a manufacturing environment 250 which may represent any appropriate facility for producing therein semiconductor products, as is, for instance, previously explained for the manufacturing environment 150. Thus, the environment 250 may comprise a plurality of process tools which may be organized in accordance with respective function or criteria, as previously explained with reference to the process modules 170A, 170B, 170C (FIG. 2b). For convenience, it may be assumed that a sequence of processes 260A, 260B, 260C may comprise a plurality of manufacturing processes and a plurality of metrology processes which may be performed in a plurality of process and metrology tools, wherein some of these tools may be used more than once, depending on the overall strategy. For example, the sequence 260A may comprise at least some processes which are involved in the fabrication of a basic transistor structure in the device level of semiconductor devices, such as the transistors 153 of the semiconductor device 152 as previously described with reference to FIGS. 1a-1b. Furthermore, the manufacturing environment 250 may be operatively connected to a yield prediction system 200 which may be configured to predict the quality distribution of semiconductor devices currently being processed in the environment 250 on the basis of measurement data M, N, O provided at several stages of an overall manufacturing flow 270, of which the sequence 260A may represent a specified portion, as previously explained. The measurement data M, N, O may represent respective data sets, each of which may at least specify one process result at an intermediate stage of the sequence 260A. For instance, the measurement data M, N, O may represent values for a thickness of a gate dielectric material, a width of spacer elements, a concentration of dopant species, measurement values with respect to strain created in a semiconductor material, dimensions of a gate electrode and the like. It should be appreciated that the measurement data M, N, O may also include electrical measurement data, if available in the intermediate stages of the sequence 260A. For example, the sequence 260A may also include manufacturing processes related to the fabrication of contact structures and metallization levels, thereby enabling efficient use of automatic test equipment for accessing respective probe pads in corresponding metallization levels, which may thus provide a connection to the corresponding test structure, which are typically distributed over each of the corresponding substrates. The prediction system 200 may comprise an interface 201 configured to receive the measurement data M, N, O which, in some illustrative embodiments, may be accomplished by appropriate interface systems for directly connecting to interfaces of process tools, while, in other cases, the interface may connect to a supervising control system such as the MES 180, as previously explained with reference to FIG. 1b. Furthermore, the system 200 may comprise a first prediction unit 202, which may, in one illustrative embodiment, be configured to determine electrical characteristics on the basis of measurement data M, N, O by using a multi-dimensional regression technique, as will be explained later on in more detail. Hence, a corresponding model for relating the input measurement data M, N, O to respective final electrical characteristics may be implemented in the unit 202, while, in other illustrative embodiments, a plurality of respective models may be provided, each of which may be designed to operate on a specific set of measurement data, if a corresponding "granularity" of the yield distribution with respect to the input measurement data is required. In other cases, a database 203 may be provided and may be operatively connected to the interface 201 and the unit 202, thereby enabling the storage of measurement data and/or of respective high dimensional models, which may then be retrieved upon demand by the prediction unit 202. In still other cases, the prediction unit 202 may be configured to generate a corresponding model on the basis of an algorithm that will be explained with reference to FIG. 2b.

Moreover, the yield prediction system 200 may comprise a second prediction unit 204 that is operatively connected to the first prediction unit 202 and may be configured so as to establish a distribution of predicted electrical characteristics, i.e., an appropriate distribution of predicted values of the final electrical characteristics for the plurality of substrates associated with the input measurement data M, N, O. That is, as previously explained, the measurement data M, N, O may typically represent the results of selected samples in order to not unduly increase overall cycle time, wherein the selection of the respective samples may also provide a desired coverage of overall manufacturing variabilities. For instance, the selected samples may represent different substrates of a specific group of substrates, such as a lot of substrates, in order to cover the variability of processes with respect to a single lot, while the samples may also be selected across individual substrates such that across-substrate variabilities may be detected. Consequently, the prediction unit 204 may thus provide an appropriate distribution of the predicted values of the electrical characteristics such that the inherent information of the initial measurement data may be "distributed" across the various substrates and across the individual substrates in order to obtain the predicted quality distribution for the group of substrates under consideration. Consequently, appropriate algorithms may be implemented in the unit 204, for instance a Monte Carlo technique may be implemented, in which inherent information of the input measurement data M, N, O may be used for obtaining the predicted distribution. In other illustrative embodiments, a multi-variate cumulative distribution function may be used, also on the basis of the inherent information of the measurement data M, N, O, in order to establish the predicted yield distribution with high reliability. The yield distribution may be obtained on the basis of conventional strategies by using the wafer sort data, i.e., the distribution of the final electrical characteristics, and appropriately grouping or "binning" the data in order to obtain the respective quality grades under consideration, such as different speed grades, storage capacity and the like.

During operation of the system 200, the measurement data M, N, O may be sequentially produced when a corresponding group of substrates is subjected to the various manufacturing processes of the sequence 260A and the corresponding measurement results may be transmitted to the interface 201, for instance directly or via the MES and the like. For example, the measurement data M, N, O may be stored in the database 203 if a substantially continuous stream of data may be supplied to the interface 201 and may be retrieved by the unit 202 when a complete set of measurement data is available for a specified group of substrates, while, in other cases, the measurement data M, N, O may be transferred to the interface 201 as a complete set of measurement data without requiring intermediate storage in the system 200. It should be appreciated that a "complete set" of measurement data may be considered as any appropriate set of measurement data for which a corresponding model is implemented in the unit 202 or may be retrieved by or created in the unit 202 in order to obtain the final electrical characteristics on the basis of the measurement data.

FIG. 2b schematically illustrates the operational behavior of the prediction unit 202 according to illustrative embodiments. As illustrated, the measurement data M, N, O may be provided in the form of sample M1, M2, M3, M4, N1, N2, N3, N4 and O1, O2, O3, O4 representing different parameters that may be obtained from a plurality of sample substrates at respective sample positions, as previously explained. For example, as shown, the same elected sample substrate 251 may sequentially undergo respective metrology processes during the manufacturing sequence 260A in order to obtain the measurement data M, N, O, while in other cases different sample substrates may be selected for the respective measurements M, N, O, depending on the overall sample selection strategy. The measurement data M, N, O may be supplied to a prediction mechanism in the unit 202 based on a multi-dimensional regression model in which final electrical characteristics EC1 . . . ECJ are related to the "independent variables" M1 . . . O4 by respective functions or coefficients $\eta$, while also a statistical error or residue $\in$ is assumed, which may represent the statistical deviation of the "observed" final electrical characteristics EC1 . . . ECJ from the "model" portion $\beta$ (M, N, O). It should be appreciated that the model 202A may include a moderately large number of coefficients or functions $\eta$ depending on the number of different measurement parameters, the number of samples of each measurement parameter and the number of the final electrical characteristics. The corresponding model or correlation between the desired observables, i.e., the final electrical characteristics EC1 . . . ECJ, and the input measurement data or independent variables M, N, O, may be obtained by the plurality of well-established data processing techniques, such as partial least square regression, multiple least squares regression, in which both appropriate coefficients are determined by minimizing the square of the difference between the actual measurement value and the mean measurement value. In other cases, the principle component regression techniques may be used, in which the input measurement data may be mapped to an appropriate coordinate system, the axes of which may represent different degrees of variance of the measurement data. For these data processing algorithms, well-established powerful computational techniques are available. Thus, the model 202A may provide respective final electrical characteristics EC1 . . . ECJ correlated to the input data M, N, O and thus correlated to the respective samples, i.e., position across the substrate and substrates across a specified group of substrates. In some illustrative embodiments, the creation of the model 202A may also be established by the prediction unit 202, as previously explained, so that the model 202A may be created "on demand" for a desired set of input data M, N, O. During the creation of the model 202A, respective historical measurement data may be retrieved for the observables EC1 . . . ECJ and the corresponding measurement data M, N, O for a large number of substrates, wherein, in some illustrative embodiments, a weighting mechanism 202B may be applied in order to enable the incorporation of additional information with respect to the manufacturing environment 250. For instance, during the creation of the model 202A, newer measurement data may be taken into consideration with a higher weight so as to base the model 202A more on the current status of the environment 250, which, for instance, may be accomplished by using appropriately selected weighting factors, applying an exponentially weighted moving average and the like. In other cases, it may have been determined that some of the measurement data M, N, O may have a significant effect on the final electrical characteristics compared to other data so that a respective weighting factor may be introduced for appropriately scaling the measurement data M, N, O in accordance with its influence on the final electrical characteristics.

Figure 2C:
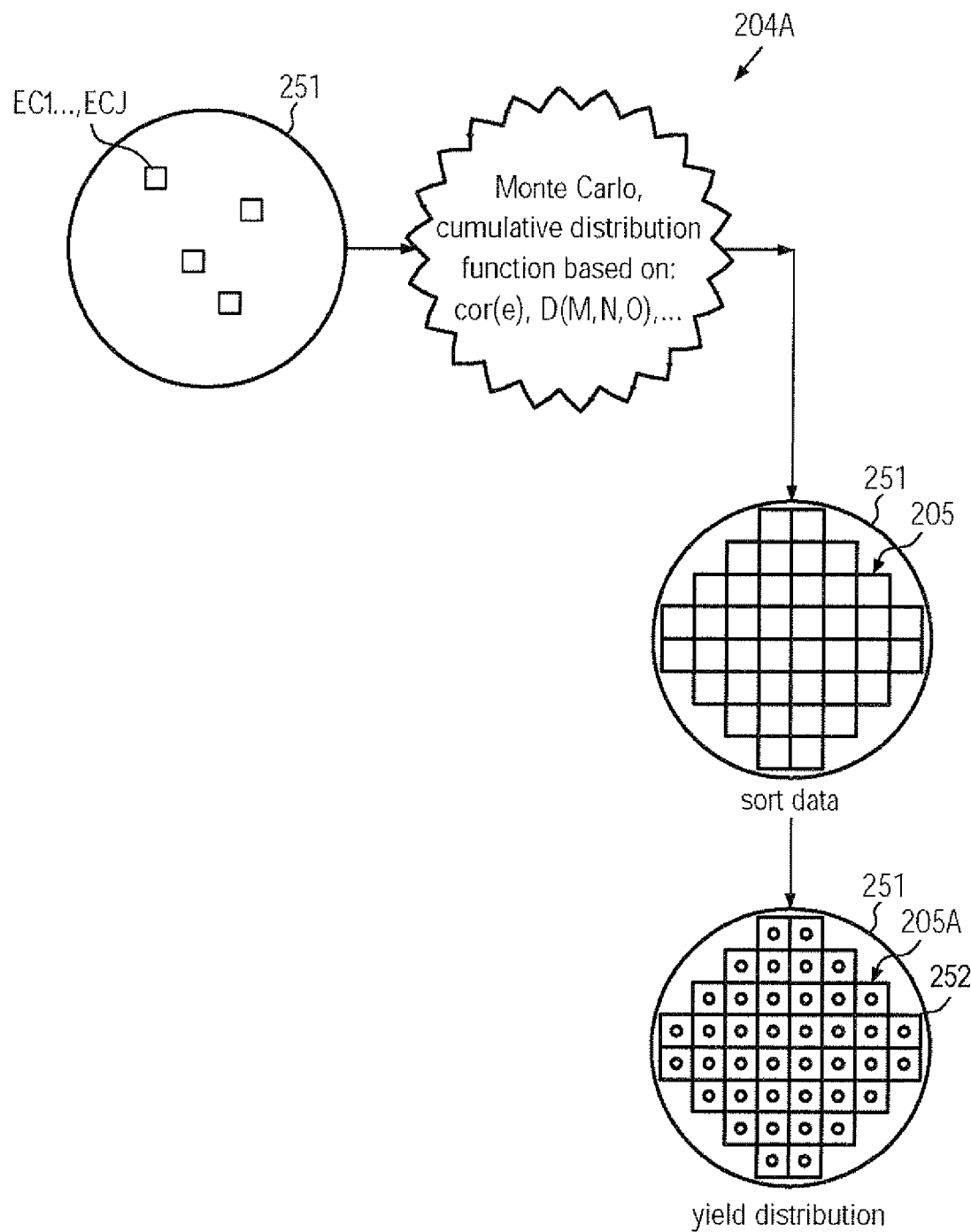
FIG. 2c schematically illustrates a second step implemented in the yield prediction system, according to still further illustrative embodiments, in which the sampled electrical characteristics may be used for determining an appropriate distribution of the "wafer sort" data, which in turn may be used for obtaining a yield distribution.

FIG. 2c schematically illustrates a mechanism 204A implemented in the second prediction unit 204 for obtaining a respective distribution of the final electrical characteristics obtained from the unit 202 so as to predict appropriate values for the electrical characteristics EC1 . . . ECJ for each of the substrates under consideration and for each position across the substrate. For this purpose, the mechanism 204A may use inherent information of the measurement data M, N, O to provide, in combination with an appropriate statistical algorithm, a respective distribution of the electrical characteristics with a high degree of reliability. In one illustrative embodiment, the mechanism 204A may be based on a Monte Carlo simulation in which a weighting of the random events may be based on the co-variance of the residues or errors of the model 202A. That is, the co-variance of two statistical events provides a statement with respect to mutual behavior. For example, a positive co-variance between the first component E1 and a second component E2 may indicate that an increasing E1 may be associated with an increase of E2, while a negative co-variance describes the situation that for a decreasing E1, E2 may increase. Since the various residues or errors E1 . . . EJ may be associated with the corresponding measurement data, the co-variance matrix of the errors may be used in the Monte Carlo simulation in order to appropriately "center" the values obtained by the Monte Carlo simulation around the predicted value obtained by the model 202A. Thus, for instance, any positional correlation or other systematic interconnection between the individual measurements M1 . . . O4 may in a more or less degree be represented by the values E1 . . . EJ of the model 202A and may therefore be reflected by the Monte Carlo simulation. Thus, a corresponding distribution 205, in the form of final electrical characteristics, is obtained which may also be referred to as wafer sort data, since the respective electrical parameters would also be obtained by measurement when the substrate 251 is actually completely processed.

In other cases, the predicted distribution 205 may be obtained on the basis of the co-variance of errors in combination with a multi-variate cumulative distribution function in which, for instance, the respective probability distribution may be "modulated" on the basis of the co-variance. In still other illustrative embodiments, the Monte Carlo simulation may be used in combination with the actual distribution of the measurements M, N, O, for example by taking the spatial distribution into consideration. In other cases, the distribution of the measurements M, N, O may be used in a cumulative distribution function, for instance by postulating that a corresponding electrical characteristic value may appropriately vary between two adjacent sample positions, for which the electrical characteristic values have been obtained on the basis of the model 202A.

Finally, the mechanism 204A may provide a quality or yield distribution 205A, in which all individual die regions 252 may be estimated on the basis of the corresponding distribution 205 of "sort data," thereby obtaining a corresponding "binning" of the die regions 252 for the group of substrates under consideration. Consequently, the final predicted yield distribution 205A may be obtained on the basis of the measurement data M, N, O by using the predicted sort data distribution 205.

Figure 2D:
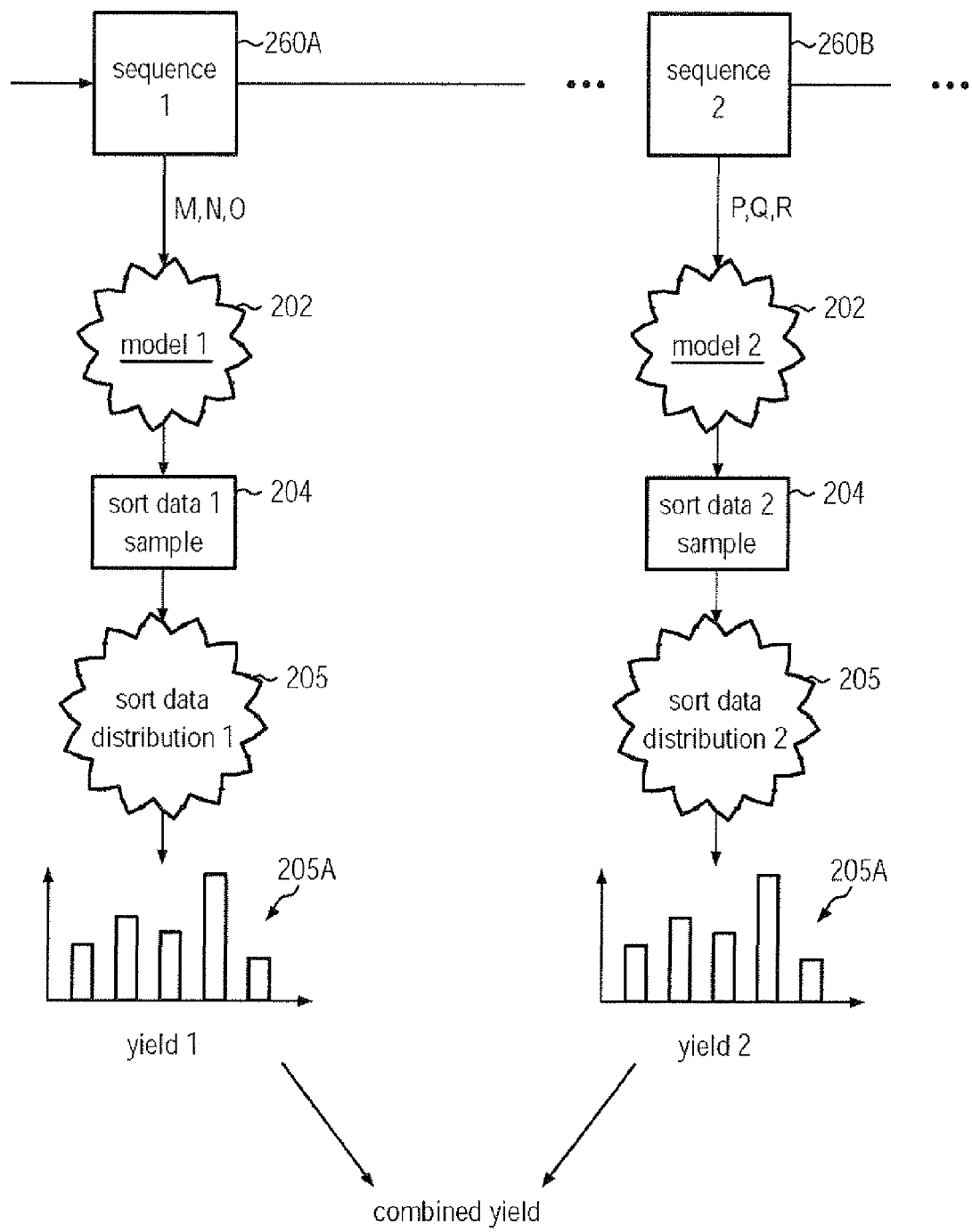
FIG. 2d schematically illustrates a process for predicting a first and a second yield distribution on the basis of a two-step mechanism in order to determine a combined predicted yield distribution, according to still further illustrative embodiments.

FIG. 2d schematically illustrates a process for obtaining a combined yield distribution or for obtaining different yield distributions on the basis of a different set of input measurement data. As shown, a first sequence 260A, such as the sequence 260A previously described, may provide the measurement data M, N, O to the prediction unit 202, which may use a first model appropriate for the data set M, N, O. Moreover, a second manufacturing sequence 260B, which may comprise at least some different processes compared to the sequence 260A, may provide measurement data P, Q, R to the unit 202, which may retrieve or create a corresponding second model appropriate for processing the data P, Q, R. Thus, respective sort data samples may be obtained in the unit 204, followed by respective sort data distributions 205, as previously explained, which may, however, be based on different input measurement data. Finally, the yield distribution 205A is obtained for the sequence 260A and a corresponding yield distribution 205A is obtained for the sequence 260B. Hence, a combined yield distribution may be established for a combined manufacturing sequence comprising the sequences 260A, 260B by combining the two yield distributions. In other cases, the respective yield distributions may be used for monitoring the quality of the respective models or for obtaining appropriate weighting coefficients to be used in creating the models, as previously explained. For example, the respective "strength" of respective process sequences may be estimated by comparing the yield distributions with the finally measured yield distribution, thereby enabling an efficient evaluation of the mutual interaction of the individual process sequences. For example, the sequence 260A may represent manufacturing processes performed on the device level, while the sequence 260B may represent a process sequence for forming one or more metallization levels of the metallization system, as previously explained with reference to the semiconductor devices 152.

As a result, the principles disclosed herein provide methods and systems for predicting the yield distribution on the basis of a plurality of measurement data, such as inline measurement data, intermediate electrical test data and the like, by first modeling the electrical characteristics for the selected samples and then establishing a distribution of the electrical characteristics to obtain wafer sort data, which may then be used for determining the predicted yield distribution. Thus, enhanced efficiency in responding to customer demands, changes of quality specifications and the like may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
obtaining, at a data processing system, measurement data from a subset of substrates selected from a group of substrates after performing a first sequence of manufacturing processes on the group of substrates in a manufacturing environment configured to produce semiconductor devices on the basis of a predefined overall manufacturing flow, said first sequence comprising at least one production process and at least one metrology process;
predicting, using the data processing system, a plurality of electrical characteristics of the semiconductor devices formed on the sample substrates using a model that represents the correlation of the plurality of electrical characteristics to said measurement data and a plurality of errors that represent a statistical deviation of the actual electrical characteristics from the predicted electrical characteristics; and
predicting, using the data processing system, a quality distribution for substantially all of said group of substrates by using said plurality of electrical characteristics predicted for the sample substrates and co-variances of the plurality of errors.

2. The method of claim 1, wherein determining said plurality of electrical characteristics comprises creating the model for mapping said measurement data on said electrical parameters by using a multi-dimensional regression technique.

3. The method of claim 2, wherein creating said model using a multi-dimensional regression technique comprises using at least one of partial least square regression, principal component regression and multiple least square regression.

4. The method of claim 3, further comprising weighting said measurement data prior to creating said model.

5. The method of claim 2, wherein predicting the quality distribution for said group of substrates comprises estimating a distribution of said electrical characteristics for each semiconductor device of said group of substrates and determining a quality state of each semiconductor device on the basis of said estimated distribution.

6. The method of claim 5, wherein estimating said distribution of electric characteristics comprises applying one of a Monte Carlo simulation technique and a cumulative distribution function on the basis of the co-variances of the errors of said model to determine said distribution of said electrical characteristics.

7. The method of claim 5, wherein estimating said distribution of electric characteristics comprises applying one of a Monte Carlo simulation technique and a cumulative distribution function on the basis of a distribution of said measurement data to determine said distribution of said electrical characteristics.

8. The method of claim 1, wherein said measurement data represent a plurality of characteristics of said semiconductor devices obtained as a process result of said one or more manufacturing processes.

9. The method of claim 1, wherein said measurement data represent a plurality of intermediate electrical characteristics obtained prior to completing said predefined overall process flow.

10. The method of claim 1, wherein said electrical characteristics represent at least some device parameters determined in a final electric test procedure performed prior to separating said substrates into individual chips.

11. The method of claim 1, further comprising:
obtaining second measurement data in said data processing system from said subset of substrates after performing a second sequence of manufacturing processes;
predicting, using the data processing system, a second plurality of electrical characteristics for said subset of substrates using a model that represents the correlation of the plurality of electrical characteristics to said second measurement data and a plurality of errors that represent a statistical deviation of the actual electrical characteristics from the predicted electrical characteristics; and
predicting, using the data processing system, a second quality distribution for substantially all of said group of substrates by using said second plurality of electrical characteristics predicted for the sample substrates and co-variances of the plurality of errors.

12. The method of claim 11, further comprising determining a combined quality distribution on the basis of said quality distribution and said second quality distribution.

13. The method of claim 12, wherein said first sequence comprises manufacturing processes corresponding to a transistor level of the semiconductor devices and said second sequence comprises manufacturing processes corresponding to a metallization level of said semiconductor devices.

14. A method, comprising:
creating, using a data processing system, a model by using a multi-dimensional regression technique, said model relating historical measurement data, obtained from a plurality of substrates comprising semiconductor devices after performing one or more manufacturing processes in a semiconductor manufacturing environment, to final electrical characteristics of said semiconductor devices; said model also indicating a plurality of errors that represent a statistical deviation of the final electrical characteristics from electrical characteristics predicted by the model;
predicting, using the data processing system, a subset of values of said final electrical characteristics, said subset including said values for selected samples of a group of substrates after performing said one or more manufacturing processes on the group of substrates, by using said model and measurement data obtained from said selected samples;
predicting, using the data processing system, a complete set of values of said final electrical characteristics using the subset of values of said final electrical characteristics and co-variances of the plurality of errors, said complete set including said values for each semiconductor device of each substrate of said group; and
determining a quality distribution of said semiconductor devices on the basis of said complete set of predicted values.

15. The method of claim 14, wherein determining said complete set of predicted values comprises applying one of a Monte Carlo simulation technique and a cumulative distribution function on the basis of a co-variance of a residue of said model.

16. The method of claim 14, wherein determining said complete set of predicted values comprises applying one of a Monte Carlo simulation technique and a cumulative distribution function on the basis of a distribution of said measurement data.

17. The method of claim 14, wherein said measurement data represent at least one of inline measurement data and electrical test data.

18. The method of claim 14, further comprising weighing said historical measurement data prior to creating said model.

19. A yield prediction system, comprising:
an interface configured to receive measurement data relating to a sequence of manufacturing processes of an overall manufacturing flow in a manufacturing environment;
a first prediction unit connected to said interface and configured to perform a data processing to predict final electrical characteristics of sample semiconductor devices on the basis of a multi-dimensional model and measurement data obtained from said sample semiconductor devices, wherein the multi-dimensional model represents the correlation of the final electrical characteristics to said measurement data and a plurality of errors that represent a statistical deviation of the actual final electrical characteristics from the predicted final electrical characteristics; and
a second prediction unit connected to said first prediction unit and configured to predict said electrical characteristics for each semiconductor device associated with a group of semiconductor devices that comprises said sample semiconductor devices and to determine a yield distribution for said group of semiconductor devices associated with said sample semiconductor devices using the predicted final electrical characteristics of the sample semiconductor devices and co-variances of the plurality of errors.

20. The system of claim 19, wherein said second prediction unit is configured to determine said final electrical characteristics by applying one of a Monte Carlo simulation technique and a cumulative distribution function on the basis of the covariances of the plurality of errors in said model.

21. The system of claim 19, wherein said second prediction unit is configured to determine said final electrical characteristics by applying one of a Monte Carlo simulation technique and a cumulative distribution function on the basis of a distribution of said measurement data.

22. The system of claim 19, further comprising a database connected to said interface, said database comprising a plurality of additional multi-dimensional models, wherein each additional model relates a different set of measurement data to said final electrical characteristics.

* * * * *